(12) United States Patent
Melikyan et al.

(10) Patent No.: US 11,244,847 B2
(45) Date of Patent: Feb. 8, 2022

(54) SUBSTRATE TREATING APPARATUS AND SUBSTRATE TREATING METHOD

(71) Applicant: SEMES CO., LTD., Chungcheongnam-do (KR)

(72) Inventors: Harutyun Melikyan, Cheonan-Si (KR); Jong Hwan An, Gyeonggi-do (KR); Jamyung Gu, Chungcheongnam-do (KR); Sang-Kee Lee, Chungcheongnam-do (KR); Young Bin Kim, Gyeonggi-do (KR); Shin-Woo Nam, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 16/174,683

(22) Filed: Oct. 30, 2018

(65) Prior Publication Data

US 2019/0131159 A1    May 2, 2019

(30) Foreign Application Priority Data

Oct. 30, 2017    (KR) .................... 10-2017-0142658

(51) Int. Cl.
*H01L 21/00*    (2006.01)
*H01L 21/683*    (2006.01)
(Continued)

(52) U.S. Cl.
CPC ........ *H01L 21/6833* (2013.01); *H01J 37/244* (2013.01); *H01J 37/3244* (2013.01);
(Continued)

(58) Field of Classification Search
CPC .......... H01L 21/6833; H01L 21/67109; H01L 21/6831; H01L 21/68735; H01J 37/244;
(Continued)

(56) References Cited

U.S. PATENT DOCUMENTS 5,531,834 A * 7/1996 Ishizuka ............... C23C 16/509
                                                            118/723 I
5,665,166 A   9/1997 Deguchi et al.
(Continued)

FOREIGN PATENT DOCUMENTS

CN    101038849 A    9/2007
CN    102157372 A    8/2011
(Continued)

OTHER PUBLICATIONS

Grant of Patent issued by the Korean Intellectual Property Office on Dec. 11, 2019 in corresponding Korean Patent Application No. 10-2017-0142658, with English translation.
(Continued)

*Primary Examiner* — Richard A Booth
(74) *Attorney, Agent, or Firm* — Carter, DeLuca & Farrell LLP

(57) ABSTRACT

Disclosed is a substrate treating apparatus. The substrate treating apparatus includes a chamber having a treatment space in the interior thereof, a support unit configured to support a substrate in the treatment space, a gas supply unit configured to supply a gas into the treatment space, and a plasma generating unit configured to generate plasma from the gas, wherein the support unit includes an electrostatic chuck including an upper body having a support surface that suctions the substrate and a lower body extending from the upper body to a lower side, wherein the lower body has an extension part extending laterally from the upper body, a focus ring disposed on the extension part of the electrostatic chuck, and a metallic ring provided between the upper body of the electrostatic chuck and the focus ring and configured to control plasma in an extreme edge of the substrate.

7 Claims, 5 Drawing Sheets

(51) Int. Cl.
*H01L 21/687* (2006.01)
*H01L 21/66* (2006.01)
*H01J 37/32* (2006.01)
*H01J 37/244* (2006.01)
*H01L 21/67* (2006.01)

(52) U.S. Cl.
CPC .. *H01J 37/32642* (2013.01); *H01J 37/32697* (2013.01); *H01J 37/32715* (2013.01); *H01L 21/67109* (2013.01); *H01L 21/6831* (2013.01); *H01L 21/68735* (2013.01); *H01L 22/20* (2013.01); *H01J 37/3211* (2013.01); *H01J 2237/002* (2013.01); *H01J 2237/24585* (2013.01); *H01J 2237/334* (2013.01)

(58) Field of Classification Search
CPC ............. H01J 37/3244; H01J 37/32642; H01J 37/32697; H01J 37/32715
See application file for complete search history.

(56) References Cited

U.S. PATENT DOCUMENTS

| | | | | |
|---|---|---|---|---|
| 5,740,009 | A * | 4/1998 | Pu | ........................ H01L 21/6831 361/234 |
| 6,039,836 | A * | 3/2000 | Dhindsa | ............ H01J 37/32623 156/345.1 |
| 6,232,236 | B1 * | 5/2001 | Shan | .................. H01J 37/32082 156/345.51 |
| 8,894,806 | B2 | 11/2014 | Koshimizu et al. | |
| 2004/0261946 | A1 * | 12/2004 | Endoh | ............... H01J 37/32082 156/345.15 |
| 2013/0008609 | A1 | 1/2013 | Koshimizu et al. | |
| 2017/0047200 | A1 * | 2/2017 | Lee | ..................... H01J 37/3244 |
| 2018/0102238 | A1 * | 4/2018 | Gu | .................... H01J 37/32183 |

FOREIGN PATENT DOCUMENTS

| | | |
|---|---|---|
| JP | 2610113 B2 | 5/1997 |
| JP | 2008244274 A | 10/2008 |
| JP | 5317424 B2 | 10/2013 |
| KR | 100290748 B1 | 6/2001 |
| KR | 20070022781 A | 2/2007 |
| KR | 20070048357 A | 5/2007 |
| KR | 1020090026321 | 3/2009 |
| KR | 1020110047084 | 5/2011 |
| KR | 1020120080544 | 7/2012 |
| KR | 101180125 B1 | 9/2012 |

OTHER PUBLICATIONS

Chinsese Office Action dated Sep. 2, 2020, for Corresponding Chinese Application No. 201811277582.2.

* cited by examiner

SUBSTRATE TREATING APPARATUS AND SUBSTRATE TREATING METHOD

CROSS-REFERENCE TO RELATED APPLICATIONS

This application claims priority under 35 U.S.C. § 119 to Korean Patent Application No. 10-2017-0142658 filed on Oct. 30, 2017, in the Korean Intellectual Property Office, the disclosures of which are incorporated by reference herein in their entireties.

BACKGROUND

Embodiments of the inventive concept described herein relate to a substrate treating apparatus and a substrate treating method, and more particularly to a substrate treating apparatus that uniformly supplies plasma to all areas of a substrate, and a substrate treating method thereof.

In order to manufacture a semiconductor device, a desired pattern is formed on a substrate by performing various processes, such as photolithography, etching, ashing, ion implantation, deposition of a thin film, and cleaning. Among them, the etching process is a process of removing a selected heating area of a film formed on a substrate, and includes wet etching and dry etching.

For dry etching, an etching apparatus using plasma is used. Generally, in order to form plasma, an electromagnetic field is formed in an interior space of a chamber and the electromagnetic field excites a process gas provided into the chamber into a plasma state.

Plasma refers to an ionized gaseous state including ions, electrons, and radicals. The plasma is generated by very high temperature, strong electric fields, or radio frequency (RF) electromagnetic fields. In the semiconductor device manufacturing process, an etching process is performed by using plasma. For the etching process, a process gas is supplied to a process chamber.

In an ICP or CCP plasma generating apparatus that performs an etching process according to the related art, a dielectric plate, on which a substrate is suctioned, is configured to be smaller than the substrate to prevent arcing (for example, when the size of the substrate is 300 mm, the size of the dielectric plate is 297 mm). Meanwhile, because the plasma density of an extreme edge of a substrate cannot be controlled due to the difference, the plasma density of the extreme edge of the substrate is different from the plasma density of another area of the substrate.

SUMMARY

Embodiments of the inventive concept provide a substrate treating apparatus that may control the plasma density of an extreme edge of a substrate by providing a metallic ring to a support unit, and a substrate treating method.

The technical objects of the inventive concept are not limited to the above-mentioned ones, and the other unmentioned technical objects will become apparent to those skilled in the art from the following description.

In accordance with an aspect of the inventive concept, there is provided a substrate treating apparatus including a chamber having a treatment space in the interior thereof, a support unit configured to support a substrate in the treatment space, a gas supply unit configured to supply a gas into the treatment space, and a plasma generating unit configured to generate plasma from the gas, wherein the support unit includes an electrostatic chuck including an upper body having a support surface that suctions the substrate and a lower body extending from the upper body to a lower side, wherein the lower body has an extension part extending laterally from the upper body, a focus ring disposed on the extension part of the electrostatic chuck, and a metallic ring provided between the upper body of the electrostatic chuck and the focus ring and configured to control plasma in an extreme edge of the substrate.

The substrate treating apparatus may further include a voltage source connected to the metallic ring and configured to apply a voltage to the metallic ring.

The voltage source may be a DC power source configured to apply a DC voltage to the metallic ring.

The substrate treating apparatus may further include a controller configured to adjust a voltage applied to the metallic ring by controlling the voltage source, and a detector configured to measure plasma densities of a central area and the extreme edge of the substrate, and the controller may adjust the voltage applied to the metallic ring such that the plasma densities of the central area and the extreme edge of the substrate are the same.

The metallic ring may be disposed to be spaced apart from the focus ring and the electrostatic chuck.

A side of the metallic ring, which faces the focus ring, and a side of the metallic ring, which faces the electrostatic chuck, may be coated with insulation films, respectively.

The metallic ring may be provided to have a structure that is separable from the support unit.

The height of the metallic ring may be larger than the width of the metallic ring.

In accordance with another aspect of the inventive concept, there is provided a substrate treating method of a substrate treating apparatus including a support unit including an electrostatic chuck including an upper body having a support surface that suctions the substrate and a lower body having an extension part extending laterally from the upper body, a focus ring disposed on the extension part of the electrostatic chuck, and a metallic ring provided between the upper body of the electrostatic chuck and the focus ring, the substrate treating method including measuring plasma densities of a central area and an extreme edge of the substrate, and adjusting a voltage directly applied to the metallic ring such that the plasma densities of the central area and the extreme edge of the substrate are the same.

A voltage source configured to apply a voltage to the metallic ring may be connected to the metallic ring.

The voltage source may be a DC power source configured to apply a DC voltage to the metallic ring.

The metallic ring may be disposed to be spaced apart from the focus ring and the electrostatic chuck.

A side of the metallic ring, which faces the focus ring, and a side of the metallic ring, which faces the electrostatic chuck, may be coated with insulation films, respectively.

The metallic ring may be provided to have a structure that is separable from the support unit.

The height of the metallic ring may be larger than the width of the metallic ring.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
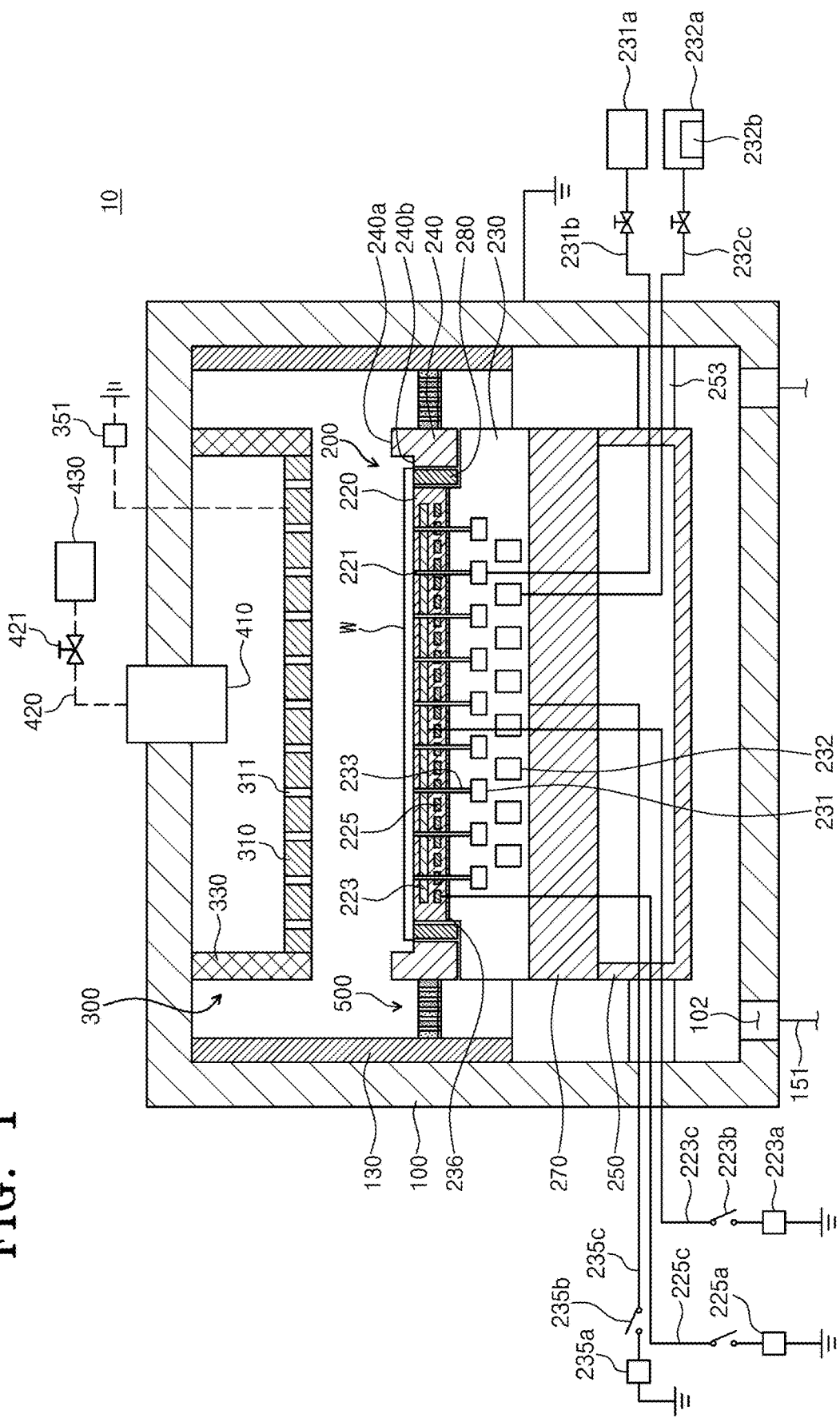
FIG. 1 is a sectional view illustrating a substrate treating apparatus according to an embodiment of the inventive concept.

FIG. 1 is a sectional view illustrating a substrate treating apparatus according to an embodiment of the inventive concept;

Referring to FIG. 1, the substrate treating apparatus 10 includes a chamber 100, a support unit 200, and a gas supply unit 400.

The substrate treating apparatus 10 treats a substrate W by using plasma. For example, the substrate treating apparatus 10 may perform an etching process on the substrate W.

The chamber 100 provides a space in which a substrate treating process is performed, in the interior thereof. The chamber 100 has an interior treatment space and has a closed shape. The chamber 100 is formed of a metallic material. The chamber 100 may be formed of aluminum. The chamber 100 may be grounded. An exhaust hole 100 is formed on the bottom surface of the chamber 100. The exhaust hole 102 is connected to an exhaust line 151. The reaction side-products generated in the process and gases left in the interior space of the chamber 100 may be discharged to the outside through the exhaust line 151. Through the exhaustion process, the pressure of the interior of the chamber 100 is reduced to a specific pressure.

According to an embodiment, a liner 130 may be provided in the interior of the chamber 100. The liner 130 has a cylindrical shape, an upper surface and a lower surface of which are opened. The liner 130 may be configured to contact an inner surface of the chamber 100. The liner 130 prevents an inner wall of the chamber 100 from being damaged due to arc discharging by protecting the inner wall of the chamber 100. Further, the liner 130 prevents the side-products generated in the substrate treating process from being deposited on the inner wall of the chamber 100. Optionally, the liner 130 may be omitted.

The support unit 200 is located in the interior of the chamber 100. The support unit 200 supports the substrate W. The support unit 200 may include an electrostatic chuck 210 configured to suction the substrate W by using an electrostatic force. The support unit 200 includes an electrostatic chuck 210, a lower cover 250, and a plate 270. The support unit 200 may be located in the interior of the chamber 100 to be spaced upwards apart from the bottom surface of the chamber 100.

The electrostatic chuck 210 includes a dielectric plate 220, a body 230, a focus ring 240, a metallic ring 280, and a temperature adjusting unit 290. The electrostatic chuck 210 supports the substrate W. The electrostatic chuck 210 has an upper body having a support surface that suctions the substrate and a lower body that extends from the upper body to a lower side, and the lower body may have an extension part extending laterally from the upper body. That is, the electrostatic chuck 210 may be configured such that the upper body and the extension part of the lower body are stepped.

The dielectric plate 220 is located in the upper body of the electrostatic chuck 210. The dielectric plate 220 is formed of a dielectric substance and has a disk shape. The substrate W is positioned on the upper surface of the dielectric plate 220. The upper surface of the dielectric plate 220 has a diameter that is smaller than that of the substrate W. Accordingly, an extreme edge of the substrate W is located on an outer side of the dielectric plate 220.

An electrode 223, a heater 225, and a first supply passage 221 are included in the interior of the dielectric plate 220. The first supply passage 221 extends from an upper surface to a bottom surface of the dielectric plate 210. A plurality of first supply passages 221 are formed to be spaced apart from each other, and are provided as passages, through which a heat transfer medium is supplied to the bottom surface of the substrate W.

The electrode 223 is electrically connected to a first power source 223a. The first power source 223a includes a DC power source. A switch 223b is installed between the electrode 223 and the first power source 223a. The electrode 223 may be electrically connected to the first power source 223a through switching-on/off of the switch 223b. If the switch 223b is on, a DC current is applied to the electrode 223. An electrostatic force is applied between the electrode 223 and the substrate W by a current applied to the electrode 223, and the substrate W is suctioned to the dielectric plate 220 by the electrostatic force.

The heater 225 may be located under the electrode 223. The heater 225 is electrically connected to a second power source 225a. The heater 225 generates resistant heat by using a current applied by the second power source 225a. The generated heat is transferred to the substrate W through the dielectric plate 220. The substrate W is maintained at a specific temperature by the heat generated by the heater 225. The heater 225 may be a spiral coil.

The focus ring 240 is disposed at an extreme edge of the electrostatic chuck 210. In detail, the focus ring 240 may be disposed an extension part of the lower body of the electrostatic chuck 210. Further, the focus ring 240 has a ring shape and is disposed along a circumference of the dielectric plate 220. An upper surface of the focus ring 240 may be stepped such that an outer side 240a thereof is higher than an inner side 240b thereof. The inner side 240b of the upper surface of the focus ring 240 may be located at the same height as that of the upper surface of the dielectric plate 220. The inner side 240b of the upper surface of the focus ring 240 supports the extreme edge of the substrate W located on an outside of the dielectric plate 220. The outer side 240a of the focus ring 240 is configured to surround the extreme edge of the substrate W. The focus ring 240 controls an electromagnetic field such that densities of plasma are uniformly distributed in the whole area of the substrate W.

Accordingly, plasma is uniformly formed over the whole area of the substrate W such that the areas of the substrate W may be uniformly treated.

The focus ring 240 may be worn out due to contact with the substrate W or by an electromagnetic force applied to the focus ring 240 in the process of the substrate treating apparatus 10. If the wearing degree of the focus ring 240 increases, a performance of adjusting the density distribution of the plasma deteriorates and the defection rate of the substrate W may increase. Accordingly, a focus ring 240 that has been used for a time has to be exchanged to prevent generation of a defection of the treated substrate W.

The metallic ring 280 is provided between the upper body of the electrostatic chuck 210 and the focus ring 240. In detail, the metallic ring 280 may be provided between the upper body of the electrostatic chuck 210 and the inner side 240b of the upper surface of the focus ring 240 on the extension part of the lower body of the electrostatic chuck 210. That is, the metallic ring 280 may be located below the extreme edge of the substrate, at which the substrate is not supported by the dielectric plate 220, to support the substrate. The metallic ring 280 may have a structure that may be separated from the support unit 200. As an example, the metallic ring 280 may be spaced apart from the focus ring 240 and the electrostatic chuck 210. In this case, a side of the metallic ring 280, which faces the focus ring 240, and a side of the metallic ring 280, which faces the electrostatic chuck 210, may be coated with insulation films, respectively. Further, the height of the metallic ring 280 may be larger than the width of the metallic ring 280, and a section of the metallic ring 280 may be long along a vertical direction. Meanwhile, the inventive concept is not limited thereto, and the metallic ring 280 may be coupled to the electrostatic chuck 210 of the support unit 200 or may have a width that is larger than the height of the metallic ring 280. Accordingly, according to the inventive concept, because the metallic ring 280 is provided between the upper body of the electrostatic chuck 210 of the substrate treating apparatus 10 and the focus ring 240, the plasma density of the extreme edge of the substrate may be controlled by controlling a voltage applied to the metallic ring 280.

That is, a voltage source 281 that applies a voltage to the metallic ring 280 may be connected to the metallic ring 280 according to the inventive concept, and the plasma density of the extreme edge of the substrate may be controlled by the voltage supplied by the voltage source 281. The voltage source 281 may be a source, a voltage of which may be adjusted. The plasma density of the extreme edge of the substrate may be adjusted by adjusting the voltage supplied to the metallic ring 280 by the voltage source 281. As an example, the voltage source 281 may be a DC power source that supplies a DC voltage. Because a constant voltage is supplied to the metallic ring 280 when the voltage source 281 is a DC power source, plasma may be controlled more precisely at the extreme edge of the substrate. Further, the voltage source 281 may supply a positive voltage (+) or a negative voltage (−), and may pull negative charges at the extreme edge of the substrate when a positive voltage is supplied by the voltage source 281 and may pull positive charges at the extreme edge of the substrate when a negative voltage is supplied by the voltage source 281. A DC filter 282 may be added between the voltage source 281 and the metallic ring 280. The DC filter 282 may filter high-frequency components, except for DC components, from the voltage supplied by the voltage source 281 and may supply only a DC voltage to the metallic ring 280.

Further, the substrate treating apparatus 10 according to the inventive concept may include a controller 610 configured to control the voltage source 281 and a detector 620 configured to measure the plasma density of the central area and the extreme edge of the substrate. The controller 610 may adjust the voltage applied to the metallic ring 280 by controlling the voltage source 281. In detail, the controller 610 may adjust the voltage applied to the metallic ring 280 such that the plasma densities of the central area and the extreme edge of the substrate, which have been measured by the detector 620, may be the same. Accordingly, the controller 610 may control a voltage applied to the metallic ring 280 such that the plasma density is uniform in all areas of the substrate, including the extreme edge.

When it is determined that the electrostatic chuck 210 is in an abnormal state, the temperature adjusting unit 290 may lower the temperature of the focus ring 240. Accordingly, when a polymer is deposited on a surface of the electrostatic chuck 210 and the temperature of the electrostatic chuck 210 increases, the temperature of the electrostatic chuck 210 may be prevented from rising by lowering the temperature of the focus ring 240.

The body 230 is located below the dielectric plate 220. The body 230 may be formed of aluminum. An upper surface of the body 230 may be stepped such that a central area thereof is higher than an extreme edge thereof. The central area of the upper surface of the body 230 may have an area corresponding to a bottom surface of the dielectric plate 220, and the bottom surface of the dielectric plate 220 may be located in the central area. The focus ring 240 may be located at the extreme edge of the body 230.

The body 230 has first circulation passages 231, second circulation passages 232, and second supply passages 233, in the interior thereof.

The first circulation passages 231 are provided as passages, through which the heat transfer medium circulates. The first circulation passages 231 may be formed in the interior of the body 230 to have a spiral shape. Further, the first circulation passages 231 may be disposed such that passages having ring shapes of different radii have the same center. The first circulation passages 231 may communicate with each other. The first circulation passages 231 are formed at the same height.

The second circulation passages 232 are provided as passages, through which a cooling fluid circulates. The second circulation passages 232 may be formed in the interior of the body 230 to have a spiral shape. Further, the second circulation passages 232 may be disposed such that passages having ring shapes of different radii have the same center. The second circulation passages 232 may communicate with each other. The second circulation passages 232 may have a sectional area that is larger than that of the first circulation passage 231. The second circulation passages 232 are formed at the same height. The second circulation passages 232 may be located under the first circulation passages 231.

The second supply passages 233 extend upwards from the first circulation passages 231, and are provided on an upper surface of the body 230. The number of the second supply passages 223 corresponds to the first supply passages 221 and the second supply passages 243 connect the first circulation passages 231 and the first supply passages 221.

The first circulation passages 231 are connected to a heat transfer medium storage 231a through heat transfer medium supply lines 231b. A heat transfer medium is stored in the heat transfer medium storage 231a. The heat transfer medium includes an inert gas. According to an example, the heat transfer medium includes a helium (He) gas. According to an embodiment, the helium gas is supplied to the first circulation passages 231 through supply lines 231b, and is supplied to the bottom surface of the substrate W after sequentially passing through the second supply passages 233 and the first supply passages 221. The helium gas functions as a medium, by which the heat transferred from plasma to the substrate W is transferred to the electrostatic chuck 210.

The second circulation passages 232 are connected to the cooling fluid storage 232a through the cooling fluid supply lines 232c. The cooling fluid storage 232a may store a cooling fluid. A cooler 232b may be provided in the cooling fluid storage 232a. The cooler 232b cools the cooling fluid to a specific temperature. Unlike this, the cooler 232b may be installed on the cooling fluid supply line 232c. The cooling fluid supplied to the second circulation passages 232 through the cooling fluid supply lines 232c cools the body 230 while circulating along the second circulation passages 232. The body 230 may cool the dielectric plate 220 and the substrate W together while being cooled to maintain the substrate W at a specific temperature.

The body 230 may include a metal plate. According to an example, the whole body 230 may be a metal plate. The body 230 may be electrically connected to a third power source 235a. The third power source 235a may be provided as a high-frequency power source that generates high-frequency electric power. The high-frequency power source may be provided as an RF power source. The body 230 receives high-frequency electric power from the third power source 235a. Accordingly, the body 230 may function as an electrode.

Figure 2:
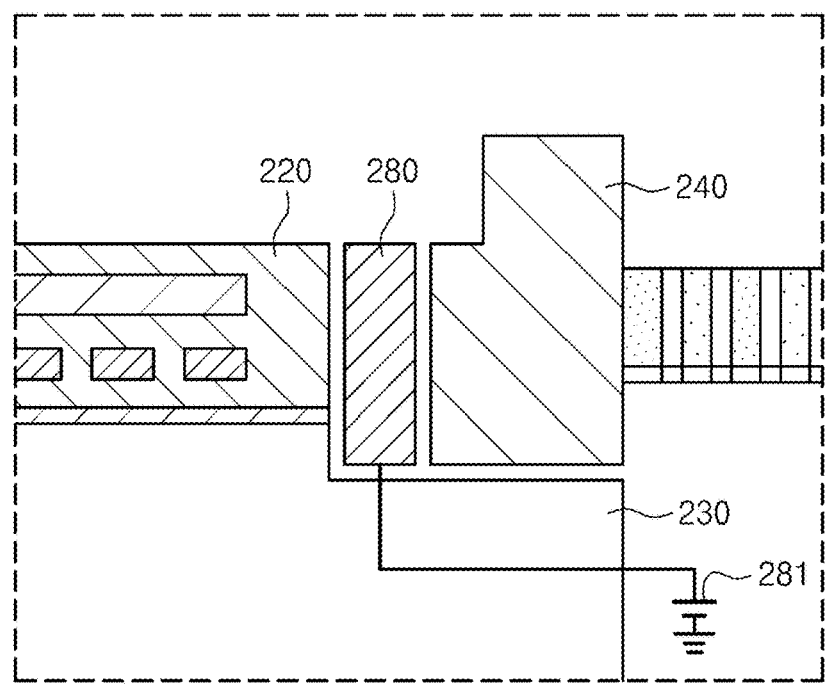
FIG. 2 is a sectional view illustrating a location at which a metallic ring is provided according to an embodiment of the inventive concept.

FIG. 2 is a sectional view illustrating a location at which a metallic ring is provided according to an embodiment of the inventive concept.

Figure 3:
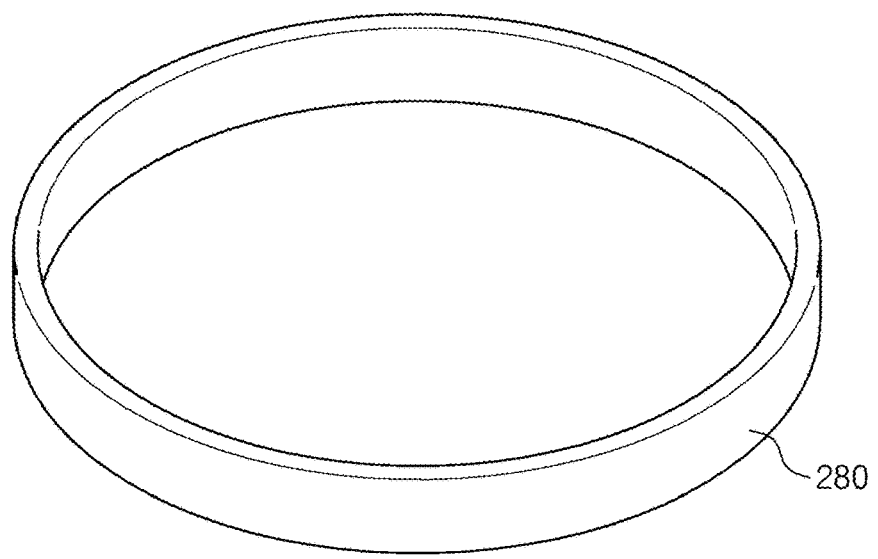
FIG. 3 is a view illustrating a shape of the metallic ring according to an embodiment of the inventive concept.

Referring to FIG. 2, the metallic ring 280 may be provided between the upper body 211 of the electrostatic chuck 210 and the focus ring 240 on the extension part 212a of the lower body 212 of the electrostatic chuck 210. That is, the metallic ring 280 may be provided between the upper body 211 of the electrostatic chuck 210 and the focus ring 240 to have the ring shape as in FIG. 3. The DC power source 281 that applies a DC voltage is connected to the metallic ring 280, and the DC power source 281 may control the density of the plasma generated in the extreme edge of the substrate by adjusting the DC voltage applied to the metallic ring 280.

Figure 4:
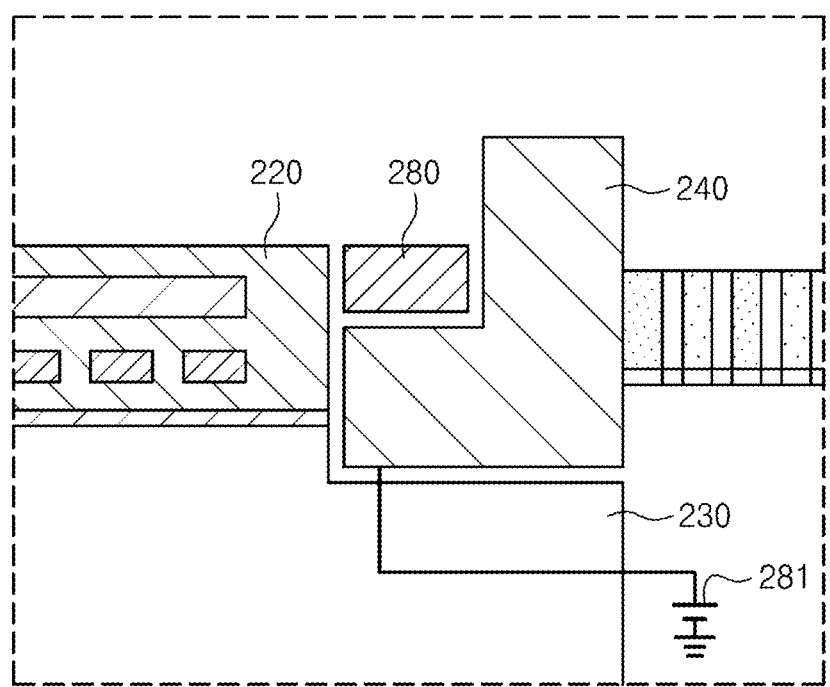
FIG. 4 is a sectional view illustrating a metallic ring according to another embodiment of the inventive concept.
Figure 5A:
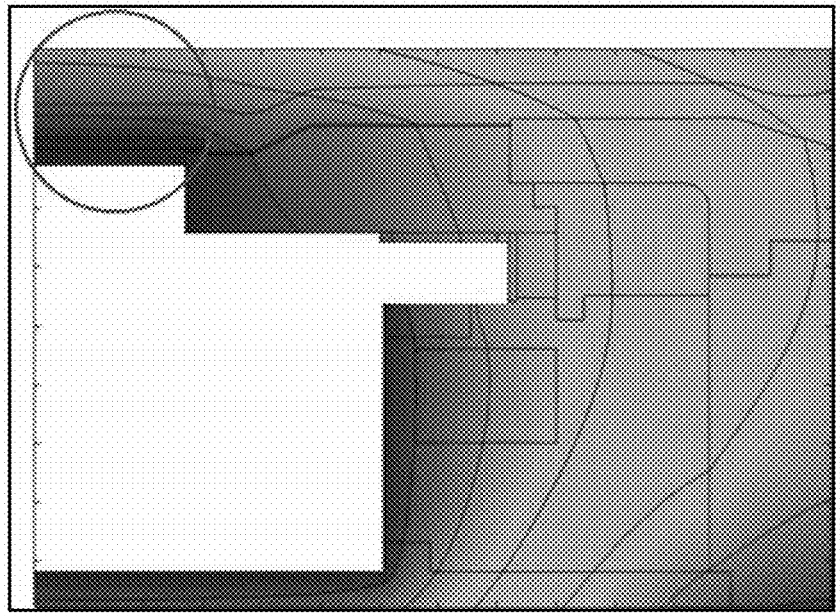
FIG. 5A is a view illustrating the plasma density of an extreme edge of a substrate in a substrate treating apparatus according to the related art.
Figure 5B:
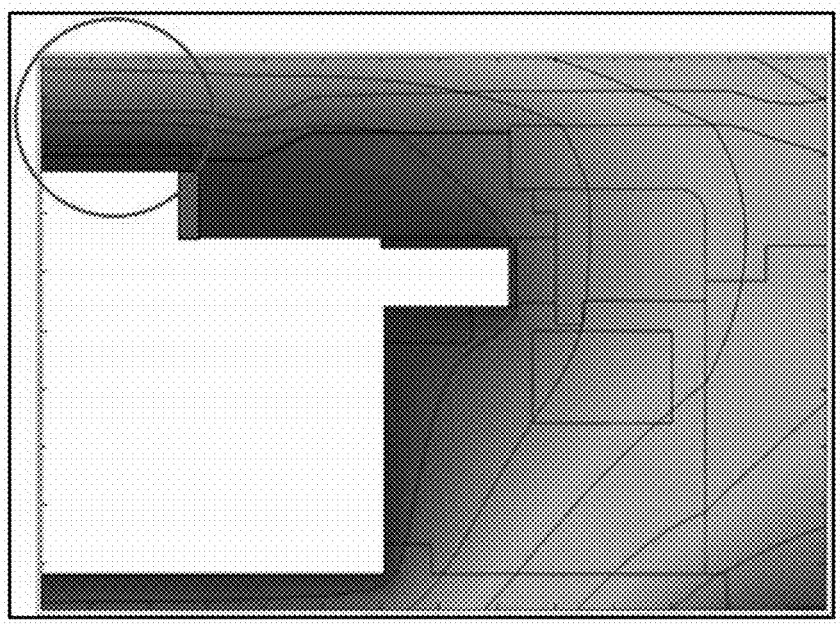
FIG. 5B is a view illustrating the plasma density of an extreme edge of a substrate in a substrate treating apparatus according to an embodiment of the inventive concept.

Further, the metallic ring 280 may have a structure that may be separated from the support unit 200. As an example, the metallic ring 280 may be spaced apart from the focus ring 240 and the electrostatic chuck 210. In this case, a side of the metallic ring 280, which faces the focus ring 240, and a side of the metallic ring 280, which faces the electrostatic chuck 210, may be coated with insulation films, respectively. Further, the height of the metallic ring 280 may be larger than the width of the metallic ring 280, and a section of the metallic ring 280 may be long along a vertical direction. A design for providing the metallic ring 280 between the focus ring 240 and the electrostatic chuck 210 may become easy according to the form of the metallic ring 280, and the plasma density of a narrow area of the extreme edge of the substrate may be controlled. As another example, the metallic ring 280 may be provided between the electrostatic chuck 210 and the focus ring 240 such that the width of the metallic ring 280 is larger than the height of the metallic ring 280 as in FIG. 4. In this case, the plasma density of a wider area in the extreme edge of the substrate may be controlled at the same time than the case in which the height of the metallic ring 280 is larger than the width of the metallic ring 280. Meanwhile, regardless of the form of the metallic ring 280, the plasma density of the extreme edge of the substrate may be controlled by providing the metallic ring 280 between the upper side 211 of the electrostatic chuck 210 and the focus ring 240 and controlling the voltage source 281 connected to the metallic ring 280. Accordingly, it may be identified that plasma is formed more uniformly in FIG. 5B in which the metallic ring 280 is provided than in FIG. 5A in which the metallic ring 280 is not provided (the contour lines of the circle area of FIG. 5B is more parallel than the contour lines of the circle area of FIG. 5A).

Figure 6:
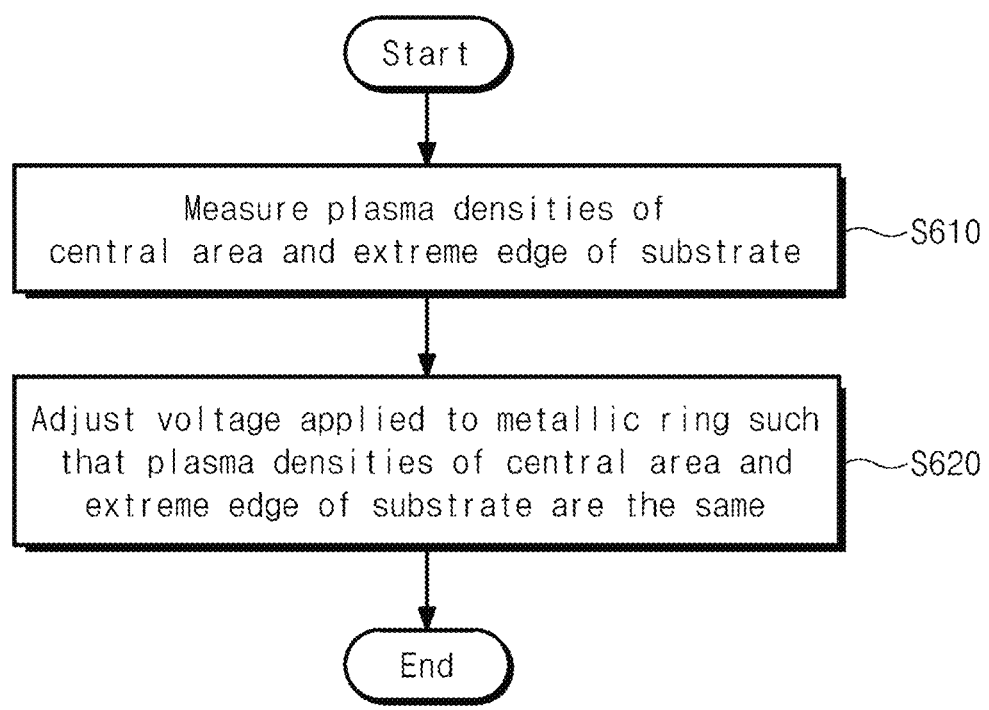
FIG. 6 is a flowchart illustrating a substrate treating method according to an embodiment of the inventive concept.

FIG. 6 is a flowchart illustrating a substrate treating method according to an embodiment of the inventive concept.

Referring to FIG. 6, first, the plasma densities of the central area and the extreme edge of the substrate are measured (S610).

Subsequently, a voltage applied to the metallic ring is adjusted such that the plasma densities of the central area and the extreme edge of the substrate are the same (S620). Here, the metallic ring may be provided between the upper body of the electrostatic chuck and the focus ring, and a voltage source that applies a voltage may be connected to the metallic ring. That is, in operation S620, the voltage applied to the metallic ring may be adjusted by controlling the voltage of the power source, and accordingly, the plasma density of the extreme edge of the substrate may be controlled. Further, the metallic ring may be provided to have a structure that may be separated from the support unit, and the height of the metallic ring may be larger than the width of the metallic ring. Further, the metallic ring may be disposed to be spaced apart from the focus ring and the electrostatic chuck, and in this case, a side of the metallic ring, which faces the focus ring, and a side of the metallic ring, which faces the electrostatic chuck, may be coated with insulation films, respectively.

Accordingly, according to various embodiments of the inventive concept, plasma may be controlled in the extreme edge of the substrate by providing the metallic ring between the upper body of the electrostatic chuck and the focus ring, and accordingly, plasma may be uniformly supplied to all the areas of the substrate.

Although it has been in the embodiments that an etching process is performed by using plasma, the substrate treating process is not limited thereto, but may be applied to various substrate treating processes that use plasma, such as a deposition process, an ashing process, and a cleaning process. Further, in the present embodiment, the structure in which the plasma generating unit is a capacitive coupled plasma source has been described. However, unlike this, the plasma generating unit may be an inductively coupled plasma (ICP) device. The inductively coupled plasma device may include an antenna.

Meanwhile, a non-transitory computer readable medium in which a program that sequentially performs the substrate treating method according to an embodiment of the inventive concept may be provided.

The non-transitory computer readable medium refers not to a medium, such as a register, a cash, or a memory, which stores data for a short time but to a medium that stores data semi-permanently and is read by a computer. In detail, the above-mentioned various applications or programs may be stored in a non-transitory computer readable medium, such as a CD, a DVD, a hard disk, a blu-ray disk, a USB, a memory card, or an ROM.

Accordingly, according to various embodiments of the inventive concept, plasma may be controlled in the extreme edge of the substrate by providing the metallic ring between the upper body of the electrostatic chuck and the focus ring, and accordingly, plasma may be uniformly supplied to all the areas of the substrate.

It is noted that the above embodiments are suggested for understanding of the inventive concept and do not limit the scope of the inventive concept, and various modifiable embodiments also fall within the scope of the inventive concept. For example, the elements illustrated in the embodiments of the inventive concept may be individually implemented, and some of the individual elements may be coupled to each other to be implemented. It should be understood that the technical protection range of the inventive concept has to be determined by the technical spirit of the claims, and the technical protection range of the inventive concept is not limited to the lexical meaning of the claims but reaches even to the equivalent inventions.

What is claimed is:

1. A substrate treating apparatus comprising:
   a chamber having a treatment space in the interior thereof;
   a support unit configured to support a substrate in the treatment space;
   a gas supply unit configured to supply a gas into the treatment space;
   a voltage source;
   a controller configured to adjust a voltage by controlling the voltage source; and
   a plasma generating unit configured to generate plasma from the gas,
   wherein the support unit includes an electrostatic chuck including an upper body having a support surface that suctions the substrate and a lower body extending from the upper body to a lower side, wherein the lower body has an extension part extending laterally from the upper body,
   wherein the electrostatic chuck includes:
      a dielectric plate having a diameter smaller than a diameter of the substrate, wherein an extreme edge of the substrate is located on an outer side of the dielectric plate;
      a focus ring disposed on the extension part of the electrostatic chuck and having an L-shape based on a cross-sectional area along a vertical direction; and
      a metallic ring configured to control plasma density in the extreme edge of the substrate,
   wherein the metallic ring is positioned over a horizontal portion of the L-shape of the focus ring, and
   wherein the controller adjusts the voltage applied to the metallic ring such that the plasma densities of a central area and the extreme edge of the substrate are the same.

2. The substrate treating apparatus of claim 1, wherein the voltage source is a DC power source configured to apply a DC voltage to the metallic ring.

3. The substrate treating apparatus of claim 1, further comprising:
   a detector configured to measure plasma densities of a central area and the extreme edge of the substrate.

4. The substrate treating apparatus of claim 1, wherein the metallic ring is disposed to be spaced apart from the focus ring and the electrostatic chuck.

5. The substrate treating apparatus of claim 1, wherein a side of the metallic ring, which faces the focus ring, and a side of the metallic ring, which faces the electrostatic chuck, are coated with insulation films, respectively.

6. The substrate treating apparatus of claim 1, wherein the metallic ring is provided to have a structure that is separable from the support unit.

7. The substrate treating apparatus of claim 1, wherein the height of the metallic ring is larger than the width of the metallic ring.

* * * * *